(12) United States Patent
Carter, Jr. et al.

(10) Patent No.: US 6,365,980 B1
(45) Date of Patent: Apr. 2, 2002

(54) THERMALLY ENHANCED SEMICONDUCTOR BALL GRID ARRAY DEVICE AND METHOD OF FABRICATION

(75) Inventors: Buford H. Carter, Jr., Richardson; Dennis D. Davis, Garland; David R. Kee, Richardson; Richard E. Johnson, Flower Mound, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/513,121

(22) Filed: Feb. 25, 2000

Related U.S. Application Data

(60) Provisional application No. 60/121,728, filed on Feb. 26, 1999.

(51) Int. Cl.[7] .......................... H01L 23/48; H01L 23/52
(52) U.S. Cl. .................. 257/787; 257/678; 257/693; 257/723; 257/783
(58) Field of Search ........................ 257/678, 693, 257/787, 723, 783; 438/107, 109, 110, 118, 112, 124, 127

(56) References Cited

U.S. PATENT DOCUMENTS

| | | | | |
|---|---|---|---|---|
| 5,355,283 A | * | 10/1994 | Marrs et al. | 361/760 |
| 5,506,756 A | * | 4/1996 | Haley | 361/789 |
| 5,668,405 A | * | 9/1997 | Yamashita | 257/668 |
| 5,777,382 A | * | 7/1998 | Abbott et al. | 257/695 |
| 6,172,419 B1 | * | 1/2001 | Kinsman | 257/737 |

FOREIGN PATENT DOCUMENTS

| | | | | |
|---|---|---|---|---|
| JP | 3-171744 | * | 7/1991 | 29/827 |

* cited by examiner

*Primary Examiner*—Jhihan B Clark
(74) *Attorney, Agent, or Firm*—Gary C. Honeycutt; Fred Telecky; Arthur I. Navarro

(57) ABSTRACT

A semiconductor device comprising a thermally conductive foil including a chip mount portion having first and second surfaces; an integrated circuit chip attached to said first surface; a body of encapsulation material molded around said chip and said first surface such that it leaves said second surface exposed; and said second surface comprising means for forming thermal contact, thereby creating a path for dissipating thermal energy from said chip. Said means for thermal contact comprise a configuration of said second surface suitable for direct thermal attachment to a heat sink. Alternatively, said means for thermal contact comprise a configuration of said second surface suitable for thermal attachment including solder balls between the chip and the heat sink.

22 Claims, 4 Drawing Sheets

THERMALLY ENHANCED SEMICONDUCTOR BALL GRID ARRAY DEVICE AND METHOD OF FABRICATION

This application claims priority under 35 USC § 119 based upon Provisional Patent Application No. 60/121,728, filed Feb. 26, 1999.

FIELD OF THE INVENTION

The present invention is related in general to the field of semiconductor devices and processes and more specifically to thermally enhanced configurations of ball grid array and chip scale packages and to a method of fabricating these configurations using thin thermally conductive foils.

DESCRIPTION OF THE RELATED ART

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

While plastic ball grid array (BGA) and chip-scale packages (CSP) became very popular in the last few years, they have been limited to fully participate in the trends for Moore's law due to a number of shortcomings. It turned out to be difficult to reduce the cost of BGAs and CSPs due to high content of plastic materials and the fixed number of fabrication process steps. The reliability of plastic BGAs and CSPs suffers from sensitivity to thermo-mechanical stress and moisture absorption. Their thermal performance remains quite limited. It is difficult to adjust the package designs to custom requirements; consequently, the package designs are not flexible enough to fit the general application trends towards smaller package outlines and thinner profiles.

Known technology focuses the attention for developing BGA and CSP package designs and processes on devices with high lead counts (or solder ball numbers) and neglects the specific needs of BGAs and CSPs for smaller lead (or solder ball) numbers. Thus, opportunities in the huge application market requiring specifically low solder ball numbers go unattended.

In the present state of the art, plastic packages with small pin count use stamped or etched leadframes; these leadframes represent the dominant materials cost in these packages. Plastic BGAs and CSPs use patterned polyimide films as substrates for mounting the semiconductor chips; these films represent the dominant materials cost in these packages. Furthermore, as a consequence of these plastic films, the thermal performance of the packages is restricted.

SUMMARY OF THE INVENTION

According to the present invention for semiconductor integrated circuit (IC) devices, the molding process for encapsulating a chip mounted on a thermally conductive foil, is used to form configurations of the foil such that it is suitable for thermal contact and thus for dissipating thermal energy from the chip. Furthermore, according to the present invention, the molding process for encapsulating a chip mounted on a sheet-like insulating substrate having metal layers on one or both surfaces, is used to form configurations of the substrate such that it is suitable both for thermal contact and for electrical potential.

The present invention is related to high density ICs, especially those having low or modest numbers of inputs/outputs or bonding pads, further to devices using an electrically conductive or metallic substrate, to which they are usually connected by wire bonding, and also to devices requiring small package outlines and low profiles. These ICs can be found in many semiconductor device families such as processors, digital and analog devices, mixed signal and standard linear and logic products, telephone, RF and telecommunications devices, intelligent power devices, and both large and small area chip categories. The invention helps to insure built-in quality and reliability in applications such as cellular communications, pagers, hard disk drives, laptop computers, and medical instrumentation.

The invention provides some material and substrate design modifications and several simplifications of basic process steps commonly practiced in semiconductor assembly and packaging technology so that a significant manufacturing cost reductions are achieved. The chips are mounted on substrates provided as thin foils in the thickness range of about 10 to 75 $\mu$m. In this thickness range, the foils responds to the molding pressure during conventional transfer molding processes, move against the steel surfaces of the mold cavity and align smoothly to the surface contours. The chip mounted on exposed foil areas is positioned during the molding operation such that it can create a path for dissipating thermal energy from the chip and can thus be used to best advantage in solder attachments. With the same ease, dimples reaching into the molded material and covered with a solderable surface can be created together with the exposed chip mount areas. The amount of elongation by which certain foil materials can stretch in order to move from their original flat configuration to a curved configuration, has been determined by this invention. Protrusions or indentions of the chip-mount area and ball-simulating elevations can be created between about 150 and 230 $\mu$m high using an annealed copper foil of about 30 to 40 $\mu$m thickness.

It is an aspect of the present invention to be applicable to a variety of different BGA and chip-scale packages, especially those for high power dissipation and with a "ball" count of about 4 to 80.

It is another aspect of the present invention to be applicable to an assembly of active IC chips and passive electronic components, attached to a substrate designed to provide both transmission of thermal energy and application of an electrical potential.

Another aspect of the present invention is to introduce manufacturing steps which contribute to the trends towards packages with lower overall profiles and smaller outlines, thus contributing to device space conservation.

Another aspect of the present invention is to enhance the package reliability by improving the adhesion between the molding compound and the metal foil used for thermal and electrical contact to the outside world.

Another aspect of the present invention is to introduce manufacturing steps which contribute to the trends towards packages with lower overall profiles and smaller outlines, thus contributing to device space conservation.

Another aspect of the present invention is to improve product quality by process simplification, and to enhance reliability assurance by enhancing thermal energy dissipation, controlling thermomechanical stress, minimizing moisture absorption, and general in-process control at no extra cost.

Another aspect of the present invention is to introduce assembly concepts for thin profile packages which are flexible so that they can be applied to many families of semiconductor products, and are general so that they can be applied to several future generations of products.

These aspects have been achieved by the teachings of the invention concerning methods suitable for mass production. Various modifications have been successfully employed to satisfy different selections of product geometries and materials.

In one embodiment of the present invention, the size of the exposure of the chip-mount area and thus the stretch of the foil material necessary to achieve this exposure is used to produce devices of low profiles and improved power handling.

In another embodiment of the invention, the thermally improved product characteristics are combined with the capability of applying electrical RF ground potential, thus opening a new way of simplified production and a wide field of product application.

In another embodiment of the invention, the exposure of chip mount areas is combined with a number of depressions and the arrangement in rows of solder ball receptors on order to produce devices of small BGA and CSP outlines and assemblies thereof.

In another embodiment of the invention, the exposure of chip mount areas is combined with a number of elevations and the arrangement in rows of simulated "balls" in order to produce devices of small BGA and CSP outlines and assemblies thereof.

In another embodiment of the invention, the shape of the electrically conductive foil carrying a fixed electrical potential such as RF ground is designed so that this potential shields a pre-determined area of an electronic assembly.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 6A is a top view of the ball grid array device.

FIG. 6B is a simplified cross section of the ball grid array device.

FIG. 6C is a simplified bottom view of the ball grid array device.

FIG. 8A is a simplified top view of the assembly.

FIG. 8B is a schematic cross section of the assembly.

DETAILED DESCRIPTION OF THE PREFERRED EMBODIMENTS

The present invention is related to integrated circuits (ICs) having small outline and low profile ball grid array (BGA) and chip-scale packages (CSP) and assemblies thereof. As defined herein, the term "outline" relates to the overall width and length of the IC package of the present invention. The outline of the package is also referred to as the footprint of the package, because it defines the surface area on a wiring or assembly board that the package will occupy. The term "chip-scale package" is used with two connotations. In the first connotation, the packages have an outline adding less than 20% to the chip area; a chip-scale package which has only the size of the chip itself, is often referred to as "chip-size package". In the second connotation, a "chip-scale package" refers simply to a small-size ball grid array.

The term "profile" refers to the thickness or height of the IC package. This definition does not include the height of the solder balls before they are reflown in board attachment.

The term solder "ball" used herein does not imply that the solder contacts are necessarily spherical. They may have various forms, such as hemispherical, half-dome, truncated cone, or generally bump. The exact shape is a function of the deposition technique (such as evaporation, plating, or prefabricated units) and reflow technique (such as infrared or radiant heat), and the material composition. Several methods are available to achieve consistency of geometrical shape by controlling amount of material and uniformity of reflow temperature. The solder "balls" may be created using various solder alloy spheres, solder paste, or conductive adhesive compounds.

Figure 1:
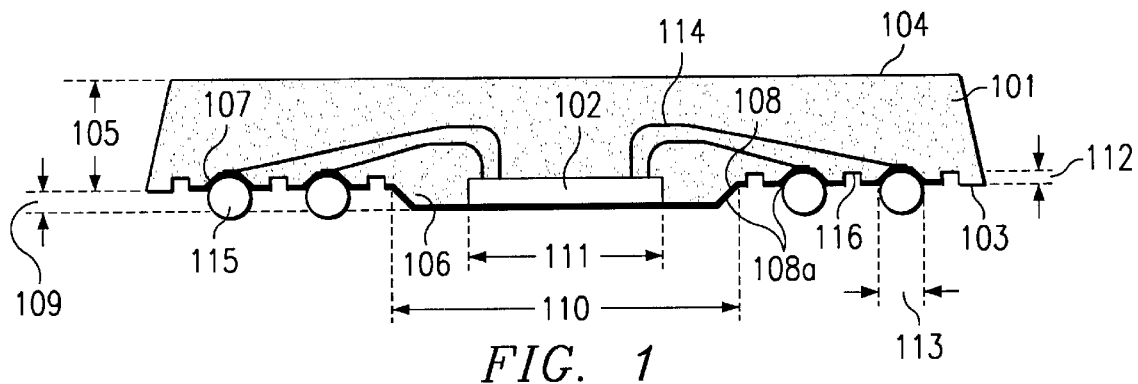
FIG. 1 is a simplified and schematic cross sectional view of a first embodiment of the present invention.

As an example of a first preferred embodiment of the present invention, FIG. 1 shows a cross section through a device having a body of encapsulation material 101 around an IC chip 102. The encapsulation material is typically an epoxy-based thermoset material as commonly used in semiconductor transfer molding processes. The molded material forms a generally flat bottom surface 103 and a generally flat top surface 104. As an example, these surfaces may have a side length of 8.0 mm; the invention, however, can easily be applied to BGA and CSP devices with square or rectangular outlines and a side length in the range from about 4.0 to 12.0 mm. By way of example, the thickness 105 of the package may be 1.0 mm.

As the cross section of the device indicates, the molded plastic 101 extends into all the elevations 106 and depressions 107, which protrude from and intrude into the generally flat bottom surface 103. It is a pivotal aspect of the present invention that these elevations and depressions are formed in the same plastic molding process which is employed to encapsulate the device. The pressure applied to the molding compound forces the foil 108 against the surface contours of the bottom mold half, thus creating elevations 106 and depressions 107. In FIG. 1, the elevation 106 has the geometry needed for a chip mount area ("pad"). The depressions 107 may be shaped as portions of a sphere and thus simulate portions of solder "balls", since they will position pre-fabricated solder balls. Consequently, they may be referred to as "dimples". Other shapes of depressions 107 include truncated cones or truncated pyramids, or any other three-dimensional form conveniently manufacturable.

The height 109 of the elevation 106 is in the range between about 0.1 to 0.25 mm. The side dimensions 110 have to be somewhat larger than the side dimensions 111 of the chip 102. Since chip sizes vary widely and may have square or rectangular contours, the dimensions and contours of elevation 106 vary widely from example to example. Typical chip sizes are for instance approximately 2.0×2.0 mm, 2.5×2.0 mm, 1.2×1.7 mm, 2.8×0.6 mm. The depth 112 of the dimples is in the range between about 0.1 to 0.25 mm, and the diameter 113 at the widest opening of the depressions is between about 0.5 and 0.75 mm.

It is crucially important for the present invention that the outside of the elevations like the chip mount pad 106 and the outside of the depressions like the dimples 107 have a thermally and electrically conductive foil 108 with a solderable surface 108a. Metal foil 108 has a thickness in the range between about 10 and 75 $\mu$m; a preferred thickness range is about 30 to 40 $\mu$m. The foil may be made of a material selected from a group consisting of copper, copper alloys, iron-nickel alloys, aluminum, steel, and invar. Suitable copper and copper alloy foils are, for instance, produced by Olin Corporation, Waterbury, Conn., USA.

The solderable surface of the foil, facing the outside of the chip mount pad and of the dimples, is selected from a group consisting of copper, nickel, palladium, silver, gold and platinum. Another option is a deposited layer of tin-lead, tin-silver, tin-indium and other solder alloys covering the outside of the chip mount pad and of the dimples. A preferred embodiment is clean copper and highly activated solder paste. The choice of the materials depends on the solder reflow technique employed (for instance, time-temperature process, availability of solder paste or flux).

The thermally conductive material of the foil and its solderable surface create a path for dissipating thermal energy away from the chip and maximize the thermal contact of the chip to an outside heat sink by direct thermal attachment. The embodiment in FIG. 1 of the invention is thus very suitable for chips of high power semiconductor devices.

FIG. 1 illustrates that the dimples 107 are electrically connected by wire bonds 114 to the terminals of the integrated circuit. Following the commonly practiced wire bonding technology, the stitch of the bonding wire is attached to the metal of the dimple, and the ball of the bonding wire to the terminal (contact pad) of the IC chip.

For electrical separation, the metal foils covering the dimples have to be mechanically separated from each other (see FIGS. 5A to 5D for fabrication process). The separation is indicated in FIG. 1 by grooves 116, produced, for example, by a mechanical cut using a saw blade (width between about 130 to 170 $\mu$m). Alternative techniques include, but are not limited to, laser beams and high-pressure water jets.

FIG. 1 indicates solder "balls" 115 positioned in and attached to dimples 107. These solder balls may comprise solder alloy spheres, solder paste or a conductive adhesive compound.

The dimples 107 may be formed as portions of a hemisphere. They are rounded so that the prefabricated solder balls 115, to be attached after completing the fabrication process of the device, fit easily into the depressions. FIG. 1 shows the dimples 107 formed as truncated pyramids. This three-dimensional geometry is the preferred embodiment of the invention, because of the easy manner in which the truncated pyramids can be manufactured as elevations in the bottom half of the mold. Dimples of hemispherical as well as truncated pyramid shape offer enlarged area for positioning and attaching the prefabricated solder balls 115 after completing the device fabrication.

Further, dimples of hemispherical as well as truncated pyramid shape increase significantly the adhesion area between the molding compound and the metal foil. Consequently, the adhesion strength is much enhanced, resulting in packages, as fabricated by the present invention, considerably less sensitive to delamination by stress or moisture.

Figure 2:
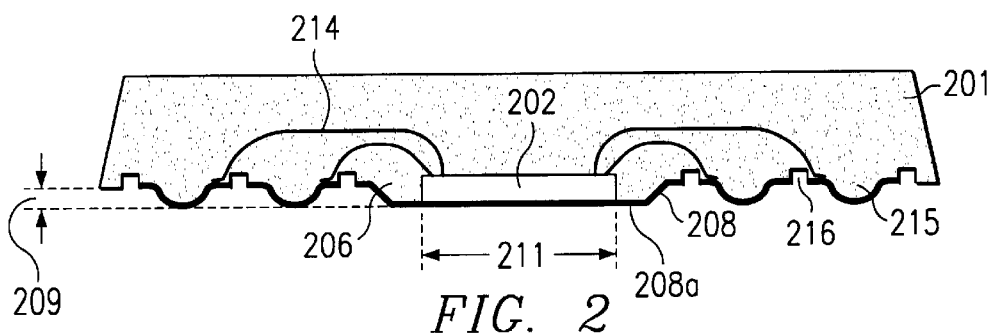
FIG. 2 is a simplified and schematic cross sectional view of a second embodiment of the present invention.

FIG. 2 illustrates a second preferred embodiment of the invention. In this embodiment, the solder balls 115 of FIG. 1 are replaced by molded, ball-simulating elevations 215, herein referred to as "knolls". Their height 209 is in the range between about 0.1 and 0.25 mm and is the same as the height of the elevation 206 of the chip mount pad. Elevations 215 are created in the same molding process as the elevation 206 of the chip mount area (detail described in FIGS. 5A to 5D). Similar to chip 102 in FIG. 1, chip 202 in FIG. 2 is attached by an adhesive layer to a thermally and electrically conductive foil 208 and surrounded by a molded encapsulation 201. Foil 208 has a thickness in the range between about 10 and 75 $\mu$m, with a preferred thickness of about 30 to 40 $\mu$m. The exposed surface 208a is solderable; consequently, the ball-simulating elevations 215 can be solder-attached to motherboards while the chip area with side length 211 is in thermal contact with the motherboard, thereby creating a path for dissipating thermal energy from chip 202.

FIG. 2 illustrates that the knolls 215 are electrically connected by wire bonds 214 to the terminals of IC chip 202. For electrical separation, foil 108 is cut by a saw blade (width between about 130 to 170 $\mu$m), laser beam, high-pressure water jet or similar techniques.

Figure 3:
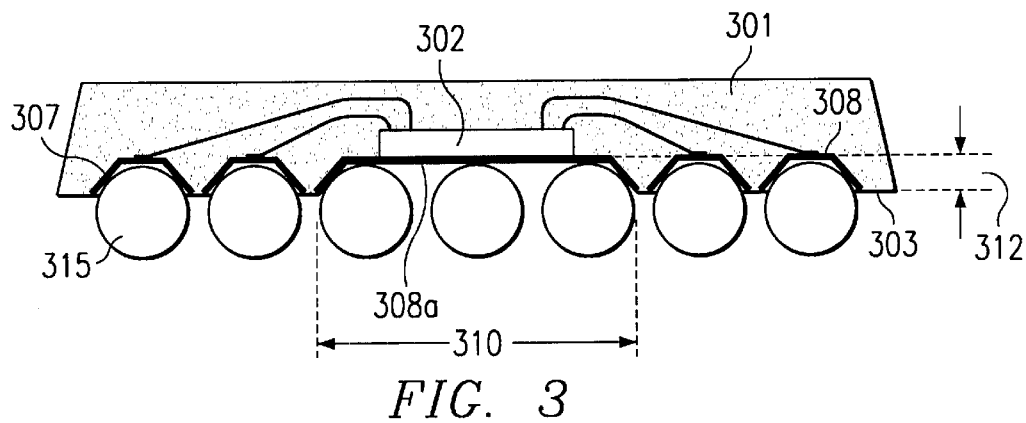
FIG. 3 is a simplified and schematic cross sectional view of a third embodiment of the present invention.

FIG. 3 illustrates a third embodiment of the invention. This embodiment offers a thermal alternative to the embodiment shown in FIG. 1. In contrast to FIGS. 1 and 2, the mount pad 310 of IC chip 302 is formed as a depression relative to the bottom surface 303 of the molded package 301. In FIG. 3, this depression has the same depth 312 as the depressions (dimples) 307 formed into bottom surface 303 for receiving the solder balls 315. The surfaces of the mount pad and the solder ball-receiving dimples exhibit foil 308, which is thermally and electrically conductive and has a solderable surface 308a.

Because of this material composition and geometrical shape, the embodiment shown in FIG. 3 offers the possibility to dispose solder balls 315 across the whole bottom surface range of the device, including the area of chip mount pad 310 and the dimples 307. The solder balls attached to the chip mount pad create a thermally conductive path for effectively dissipating the heat from chip 302 to the motherboard.

Figure 4:
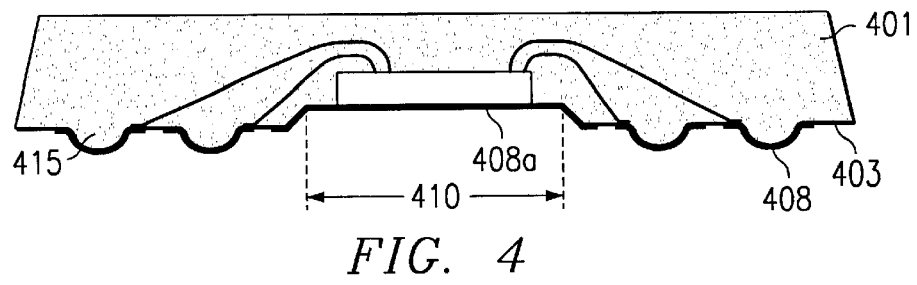
FIG. 4 is a simplified and schematic cross sectional view of a fourth embodiment of the present invention.

FIG. 4 displays a fourth embodiment of the present invention, which is a thermal alternative to the embodiment shown in FIG. 2. The chip mount pad of length 410 is recessed, while the ball-simulating knolls are elevated relative to the bottom surface 403 of the molded package 401. The surfaces of the mount pad and the ball-simulating knolls exhibit foil 408, which is thermally and electrically conductive and has a solderable surface 308a. The geometries and materials of the embodiment shown in FIG. 4 may be similar to the parameters discussed in FIGS. 1 and 2, but offer a flexible range for variation. The embodiment of FIG. 4 is especially well suited for thin profile devices (total thickness 1.0 mm or less).

FIGS. 5A through 5D illustrate the method for fabricating a typical IC device according to the invention. The example chosen in FIGS. 5A to 5D is the embodiment of the invention discussed in FIG. 2, but analogous method descriptions hold for the embodiments displayed in FIGS. 1, 3, and 4, and also apply to many other device types, assemblies and embodiments.

Figure 5A:
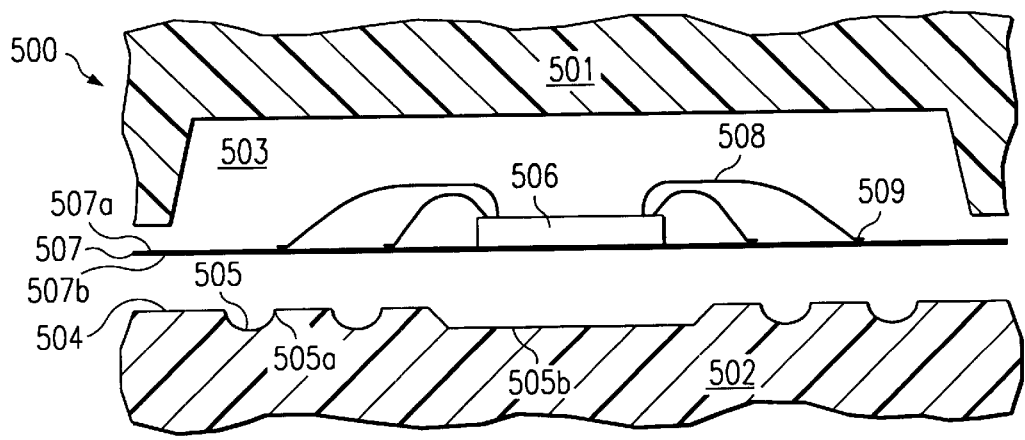
FIGS. 5A through 5C are simplified and schematic cross sections through a mold cavity illustrating the process of creating a device according to the invention.

In FIG. 5A, a simplified and schematic cross section through a mold, generally designated 500, shows the top half 501 of the mold, the bottom half 502, and the cavity 503. The bottom half 502 features a generally flat surface contour 504 including a plurality of dimples 505. These dimples have a size and shape commensurate with the goal of creating molded elevations simulating solder balls on the devices-to-be-encapsulated. The edges 505a of dimples 505 are polished in order to avoid sharp edges. The dimples may have a shape selected from a group consisting of hemisphere, truncated cone, truncated pyramid, and related geometries which can be manufactured in the mold steel at low cost.

The lower mold half 502 in FIG. 5A further has a depression 505b of a size and shape (area and periphery) determined by IC chip 506. The depth of depression 505b is preferably the same as the depth of dimples 505.

FIG. 5A further shows the cavity 503 holding a pre-assembled IC chip 506. In other embodiments of the invention, a plurality of IC chips and/or other electronic components may be pre-assembled. Chip 506 is attached onto the first surface 507a of an electrically conductive sheet-like substrate 507; according to the invention, this substrate preferably is a metal foil about 10 to 75 $\mu$m thick. The second surface 507b of substrate 507 is prepared so that it is solderable. The chip attachment is accomplished by an adhesive epoxy or polyimide film. The input/output terminals of chip 506 are connected, preferably by wires 508, to the substrate 507. Typically, the wires 508 are connected by ball bonding to the chip terminals and by stitch bonding to the substrate; however, wedge bonding of both wire ends is a viable alternative.

Figure 5B:
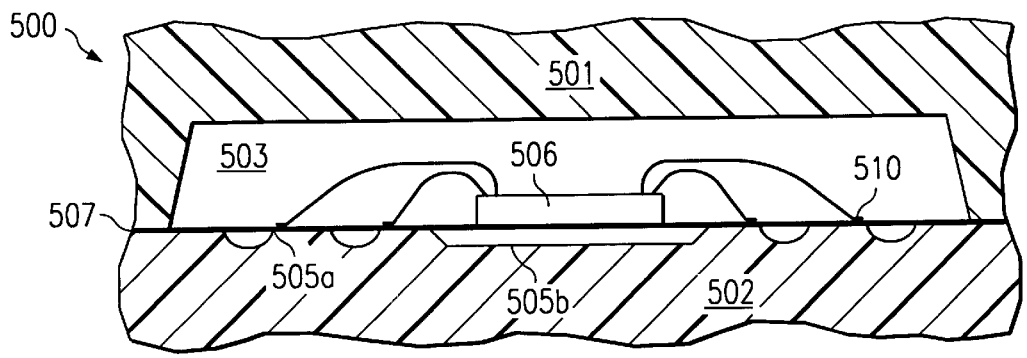

The chip, pre-assembled on the substrate, is placed on the bottom mold half 502 so that the locations 509 where the wires are welded onto the substrate 507 are aligned relative to the respective locations of the dimples 505 in the bottom mold half. This alignment is generally designated 510 as indicated in FIG. 5B. The mold is then closed (see FIG. 5B).

Figure 5C:
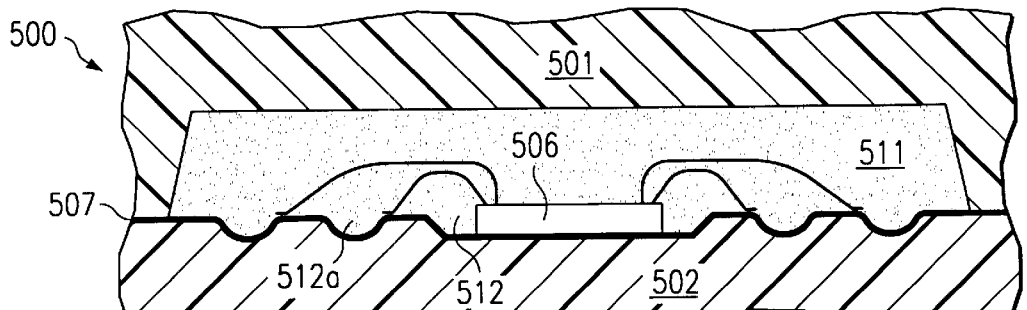

As indicated in FIG. 5C, encapsulation material 511 is pressured into cavity 503 until the cavity is filled with material. Preferably, established transfer molding processes and controls are used, in conjunction with epoxy-based molding compounds (transfer temperatures are usually between about 170 and 180° C., transfer times between about 6 and 18 s). Typical ram pressures range from about 500 to 700 psi, which produces a pressure in the mold cavity (dependent on cavity size) of between about 800 to 1600 psi. It is important for the present invention that in the molding process and at these pressures, foil 507 is moved against the surface contours of bottom mold half 502, especially into mold depression 505b and dimples 505. The molding temperature is then allowed to drop; within about 90 to 130 s, the molding compound solidifies and polymerizes at least partially so that the mold can be opened. Molded elevation 512 of at least the size of chip 506, and molded knolls 512a have thus been produced on the body of the solidified encapsulation material, surrounded on the outer elevation and knoll surfaces by foil 507. As FIG. 5C shows, each knoll has a wire bond connecting it to a respective terminal of chip 506.

It should be mentioned that the formation of the chip-size elevation and the knolls increases the surface area between molding compound and foil significantly; consequently, the adhesion between the molding compound and the metal foil is enhanced, a fact which reduces the stress and moisture sensitivity of the finished device and thus enhances its reliability.

Figure 5D:
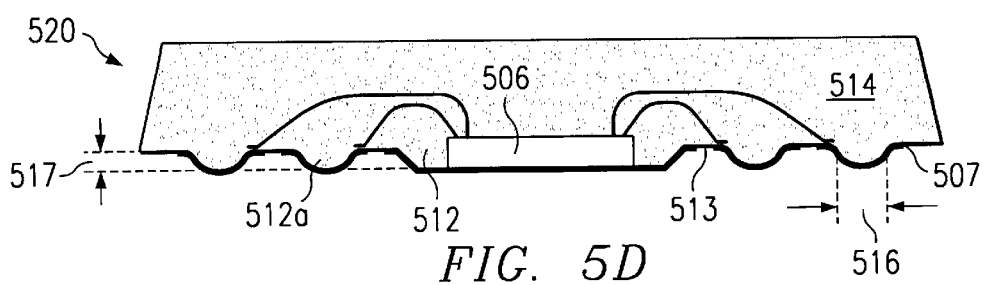
FIG. 5D is a simplified and schematic cross section through a device fabricated by the process of the invention.

FIG. 5D displays a finished device, generally designated 520. In this device, the chip-mount area (chip pad) 512 and the knolls 512a are electrically separated from each other by openings 513. These openings may be cut by high-speed saws, focused lasers, high pressure liquid jets or any other low-cost technique. It is an important advantage of the invention that the formation of the chip-pad elevation and the knolls moves the conductive foil out of the high-shear zone encountered during the dicing operation and thus contributes to high quality of the devices being produced.

If more than one unit was placed into cavity 503, the units can be mechanically singulated from each other, typically by sawing along the (vertical) edges 514. By this method, a plurality of devices similar to 520 can be fabricated in low-cost processes.

Referring to FIG. 5D, the height 517 of chip pad elevation 512 and the size of knolls 512a, as given by diameter 516 and height 517, are predominantly determined by the mechanical properties of the metal foil 507. With suitable microcrystallinity and mechanical and thermal history, a copper foil of about 30 to 40 $\mu$m thickness can elongate by about 15 to 22%. This means that for a desired knoll diameter of about 0.7 mm, a knoll height of about 0.2 mm, as well as a height of 0.7 mm for the chip pad elevation can be achieved. With this height, BGA and CSP devices of 1.0 mm profile can be produced which include the "ball" height in the overall thickness.

Figure 6A:
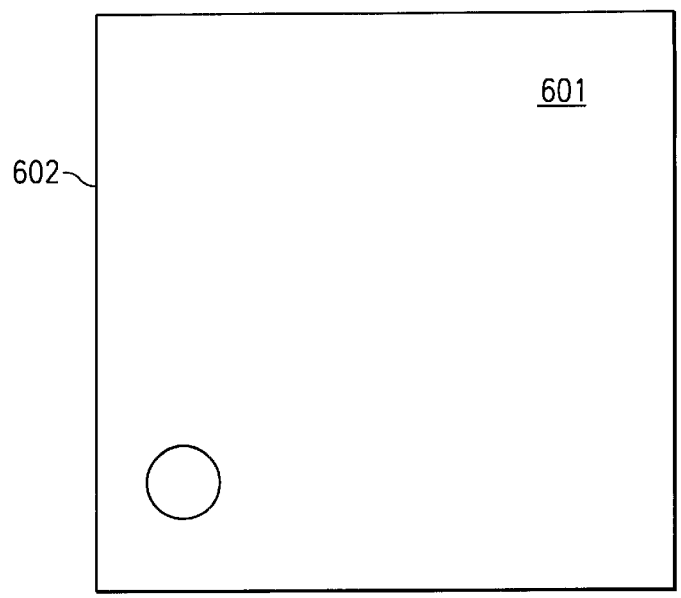
FIGS. 6A, 6B and 6C are simplified views of a ball grid array-type device according to a fifth embodiment of the invention.
Figure 6B:
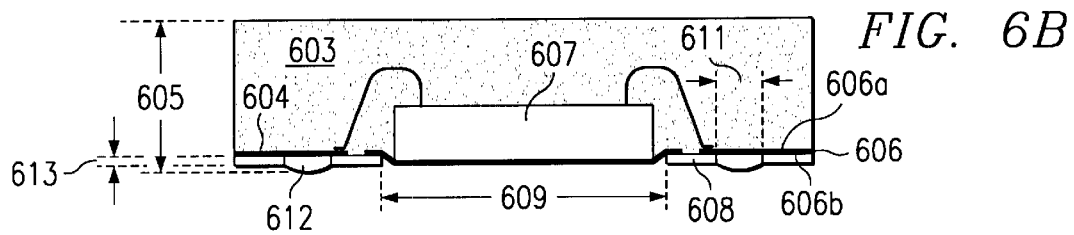
Figure 6C:
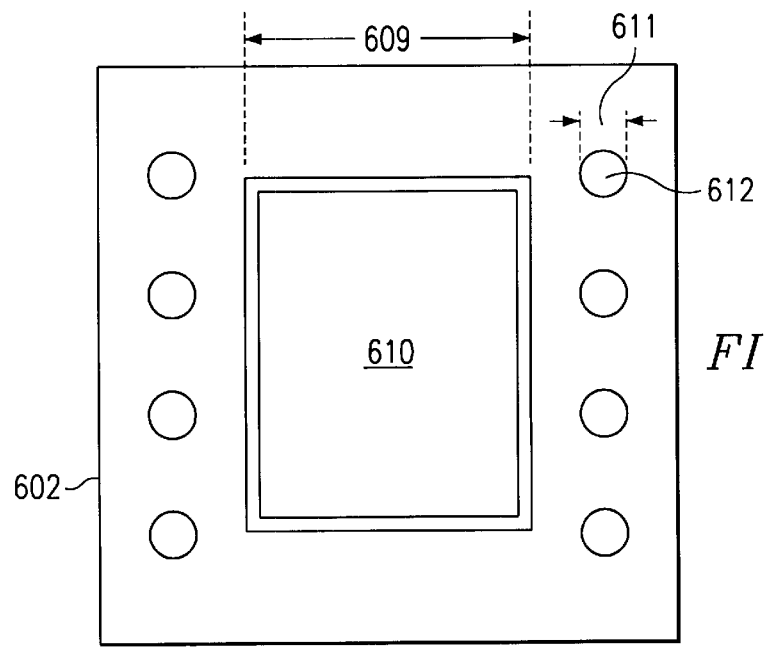

An example of a fifth embodiment of the present invention, a thermally enhanced CSP, or small BGA with 8 connections, is illustrated in FIGS. 6A through 6C. FIG. 6A is a top view of the square-shaped package with plastic encapsulation material 601 (typically an epoxy-based thermoset material as commonly used in transfer molding processes). Side length 602 is about 5.0 mm. However, the invention can easily be applied to CSP or BGA devices with square or rectangular outline and a side length in the range from 3.0 to 12.0 mm.

FIG. 6B is a cross section through the device showing its molded plastic and its generally flat bottom surface 604. The overall thickness 605 of the package is in the range of 1.0 mm. This device is assembled onto a thin flexible clad-film substrate composed of a patterned conductive foil bonded to an insulating material such as polyimide. The device has a thermally and electrically conductive foil 606 with a first surface 606a and a second surface 606b. Examples for material and thickness of the foil, typically between 10 and 75 $\mu$m, are discussed above in conjunction with FIGS. 1 to 4; the second surface 606b is usually solderable. An IC chip 607 is attached to the first surface 606a. The insulating substrate 608 which is bonded to the second surface 606b is about 50 to 130 $\mu$m thick. Other choices for the insulating substrate are polymer tapes, organic films, polymer board, epoxy resin, or cyanate ester resin reinforced with woven glass cloth. It is important for the present invention that the insulating substrate 608 has an opening 609; this opening has the shape and at least the area of chip 607. This fact is also illustrated in FIG. 6C, which displays the bottom view of the package. Alternatively, custom or complex circuit interconnections can be provided by using a multi-layer clad substrate material.

The opening 609 in the insulating substrate 608 provides an exposure of the second surface 606b of foil 606. Consequently, this exposed foil portion has the shape and at least the area of chip 607. In FIG. 6C, this exposed area is designated 610. Furthermore, substrate 608 has a plurality of openings of diameter 611, comparable to typical solder ball diameters, into which solder balls may be attached, or which may be filled with solder material and serve as electrical connections to the outside world. FIG. 6C shows 8 of these connections, designated 612.

The transfer molding process, described in detail above in conjunction with FIGS. 5A to 5D, is performed in a mold with a bottom half having surface contours of depressions or elevations. For producing a device as shown in FIGS. 6A to 6C, the bottom mold half has a depression commensurate with the chip pad. It is important for the present invention that at the molding pressure in the cavity, the foil 606 is moved by the molding compound against the mold surface contours; in the process, the elevation 613 of the chip pad area 610 is created. Elevation 613 is usually at least as high as the plastic substrate thickness (for example, 50 to 130 $\mu$m), but may be designed to any height.

While the encapsulation material 603 is molded around chip 607 and the first surface 606a of the foil 606, it leaves the second surface 606b and thus the chip pad area 610 exposed. This area, usually having a solderable surface, is now ready for direct thermal attachment to a heat sink, thereby creating the shortest possible path for dissipating thermal energy from chip 607. Alternatively, the thermal attachment may include solder balls between the chip and the heat sink.

The openings of diameter 611 may be filled with small solder balls, solder alloy, solder paste, or conductive adhesive compounds to form connections, or bumps, 612. As can be seen from FIG. 6B, bumps 612 are electrically separated from each other and from the chip, due to insulating substrate 608 thereby avoiding an additional process step of singulating the contacts.

Figure 7:
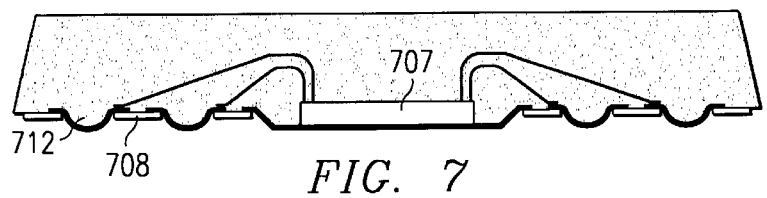
FIG. 7 is a simplified and schematic cross sectional view of a sixth embodiment of the present invention.

The sixth embodiment of the present invention is shown in FIG. 7 as a BGA with solder ball-simulating elevations 712 and insulating substrate 708. The fabrication process of this device is analogous to the one described in FIGS. 5A to 5D; however, using substrate, or polymer tape, 708 eliminates the process step of electrically singulating the contacts 712 from each other and from chip 707.

Figure 8A:
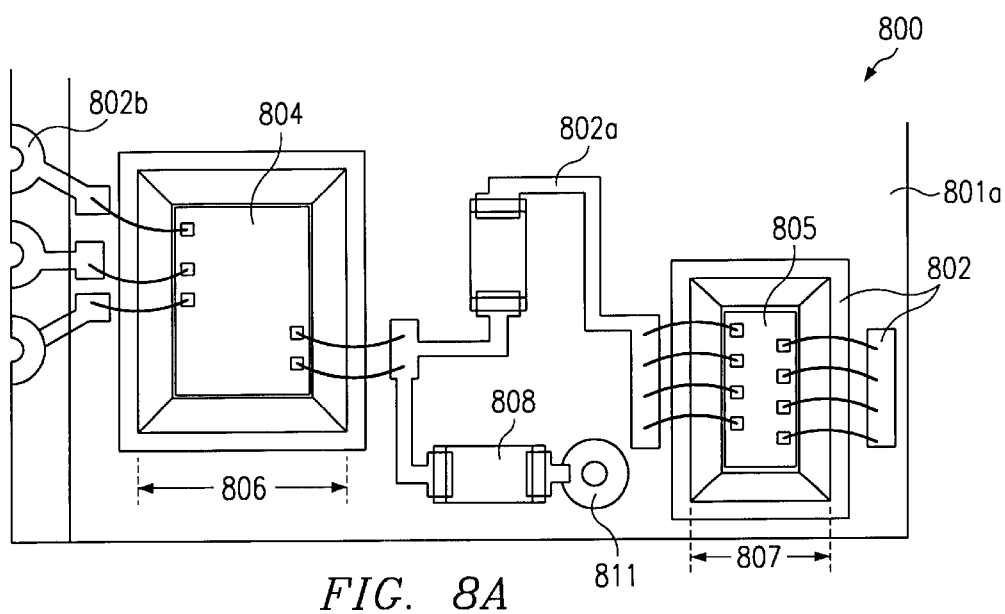
FIGS. 8A and 8B are simplified views of an assembly according to a seventh embodiment of the present invention.
Figure 8B:
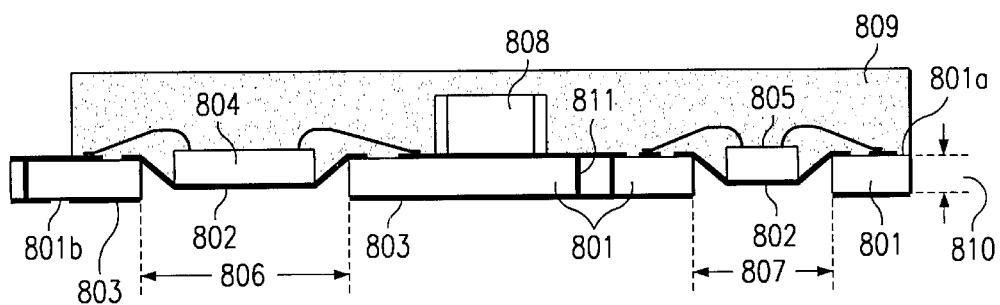

The example in FIGS. 8A and 8B of a seventh embodiment of the present invention comprises a chip-scale/BGA overmolded RF power multi-chip module. FIG. 8A depicts a portion of the module and shows the assembly of 2 chips, 2 discrete components and imbedded components interconnected on a thin double-sided printed circuit substrate. FIG. 8A is a simplified top view, FIG. 8B is a simplified and schematic cross section of the assembly, generally designated 800. The sheet-like insulating substrate 801 (typically between 250 and 800 $\mu$m thick) has first surface 801a and second surface 801b. A first thermally and electrically conductive foil 802 is attached to the first surface 801a of the substrate. A second thermally and electrically conductive foil 803 is attached to the second surface 801b of the substrate. Two IC chips 804 and 805 are attached to the first conductive foil 802.

It is essential for the present invention that substrate 801 and the second foil 803 have openings 806 and 807 at the locations of chips 804 and 805, respectively. As indicated in FIGS. 8A and 8B, the openings have the same general shape as the chips, but have larger areas than the respective chips. In these openings, portions of the first conductive foil 802 are exposed; these portions have at least the size of the respective chips. A plurality of other electronic components 808 (usually passive components such as resistors, capacitances, and inductances) are attached to portions 802a of the first conductive foil; these portions 802a may provide distributed circuit elements or controlled impedances.

Using the transfer molding process described above (see FIGS. 5A to 5D) and a suitably prepared surface contours of the mold, molding compound 809 encapsulates the assembly such that the compound leaves the second foil 803 exposed. As described above, the pressure in the mold, exerted on the molding compound during the molding process, creates elevations 810 of the first foil 802 at the locations of the attached chips. These elevations are usually at least as high as the plastic substrate thickness, but may be designed to any height.

An alternate approach is to mechanically displace the exposed foil areas prior to module assembly and to protect the chips and module with cast/encapsulating material.

The exposed areas of first foil 802, usually having a solderable surface, are now ready for direct thermal attachment to a heat sink, thereby creating the shortest possible paths for dissipating thermal energy from the chips. Alternatively, the thermal attachments may include solder balls between the chips and the heat sink.

It is essential for the embodiment displayed in FIGS. 8A and 8B that the second conductive foil 803 offers means for forming electrical contact. Using this capability, RF ground potential or other shielding potentials essential in devices for high-frequency applications, can be applied to the assembly. In some variations of this capability, vias (such as 811 in FIGS. 8A and 8B) may distribute the applied potential also to the first conductive foil 802. In other variations, package signal solder contacts 802b are formed from first foil 802. In yet another variation, other discrete components are added to the plurality of passive components 808.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, by using suitably flexible foils, the shape of the molded "ball"-simulating elevations can be modified to elongated structures. It is therefore intended that the appended claims encompass any such modifications or embodiments.

We claim:

1. A semiconductor device comprising:
   a thermally conductive foil including a chip mount portion having first and second surfaces;
   an integrated circuit chip attached to said first surface;
   a body of encapsulation material molded around said chip and said first surface such that it leaves said second surface exposed; and said second surface comprising means for forming thermal contact including a solderable metal selected from the group consisting of copper, nickel, palladium, silver, gold, platinum, tin-lead, tin-silver, tin-indium, and other solder alloys, thereby creating a path for dissipating thermal energy from said chip.

2. The device according to claim 1 wherein said means for thermal contact comprise a configuration of said second surface suitable for direct thermal attachment to a heat sink.

3. The device according to claim 1 wherein said means for thermal contact comprise a configuration of said second surface suitable for thermal attachment including solder balls between the chip and the heat sink.

4. The device according to claim 1 wherein said foil has a thickness of between about 10 and 75 $\mu$m.

5. The device according to claim 1 wherein said foil has a thickness of about 30 to 40 $\mu$m.

6. The device according to claim 1 wherein said foil comprises a material selected from a group consisting of copper, copper alloys, iron-nickel alloys, aluminum, steel, and invar.

7. The device according to claim 3 wherein said solder balls are made of solder alloy, solder paste or conductive adhesive compounds.

8. The device according to claims 2 and 3 wherein said configuration of said second surface is formed in the molding process for encapsulating said chip.

9. A semiconductor device comprising:

a thermally conductive foil having first and second surfaces;

an integrated circuit chip attached to said first surface;

an insulating substrate attached to said second surface, said substrate having an opening at the location of said chip, whereby a portion of said second surface, having an area of at least the size of said chip, remains exposed;

a body of encapsulation material molded around said chip and said first surface such that it leaves said second surface exposed; and said second surface comprising means for forming thermal contact, thereby creating a path for dissipating thermal energy from said chip.

10. The device according to claim 9 wherein said means for thermal contact comprise a configuration of said second surface suitable for direct thermal attachment to a heat sink.

11. The device according to claim 9 wherein said means for thermal contact comprise a configuration of said second surface suitable for thermal attachment including solder balls between the chip and the heat sink.

12. The device according to claim 9 wherein said foil has a thickness of between about 10 and 75 $\mu$m.

13. The device according to claim 9 wherein said insulating substrate is selected from a group consisting of polymer film, organic film, polymer board, epoxy resin or cyanate ester resin reinforced with woven glass cloth.

14. The device according to claims 10 and 11 wherein said configuration of said second surface is formed in the molding process for encapsulating said chip.

15. A semiconductor device comprising:

a sheet-like insulating substrate having first and second surfaces;

a first thermally and electrically conductive foil attached to said first surface, and a second thermally and electrically conductive foil attached to said second surface;

an integrated circuit chip attached to said first foil;

said substrate and said second foil having an opening at the location of said chip, whereby a portion of said first foil, having an area of at least the size of said chip, is exposed;

a body of encapsulation material molded around said chip and said first foil such that it leaves the second foil exposed;

said first foil comprising means for forming thermal contact, thereby creating a path for dissipating thermal energy from said chip; and said second foil comprising means for forming electrical contact.

16. The device according to claim 15 wherein said means for forming electrical contact creates an electrical RF ground potential.

17. The device according to claim 15 wherein said means for thermal contact comprise a configuration of said first foil suitable for direct thermal attachment to a heat sink.

18. The device according to claim 15 wherein said means for thermal contact comprise a configuration of said first foil suitable for thermal attachment including solder balls between the chip and the heat sink.

19. The device according to claim 15 wherein said first and second foils have a thickness of between about 10 and 75 $\mu$m.

20. The device according to claim 15 further having at least one passive electrical component attached to said first foil.

21. The device according to claims 17 and 18 wherein said configuration of said first foil is formed in the molding process for encapsulating said chip.

22. The device according to claim 20 wherein said passive electrical component is selected from a group consisting of resistors, capacitors, and inductors.

* * * * *